US011399446B2

(12) United States Patent
Chiu et al.

(10) Patent No.: US 11,399,446 B2
(45) Date of Patent: Jul. 26, 2022

(54) WATER COOLING HEAT DISSIPATION STRUCTURE

(71) Applicant: ASIA VITAL COMPONENTS CO., LTD., New Taipei (TW)

(72) Inventors: Jung-Yi Chiu, New Taipei (TW); Fu-Kuei Chang, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 55 days.

(21) Appl. No.: 16/939,069

(22) Filed: Jul. 27, 2020

(65) Prior Publication Data

US 2020/0359529 A1 Nov. 12, 2020

Related U.S. Application Data

(62) Division of application No. 15/925,894, filed on Mar. 20, 2018, now Pat. No. 10,813,250.

(51) Int. Cl.
*H05K 7/20* (2006.01)
*F28F 3/08* (2006.01)
(Continued)

(52) U.S. Cl.
CPC ......... *H05K 7/20263* (2013.01); *F28F 3/048* (2013.01); *F28F 3/086* (2013.01); *F28F 9/0221* (2013.01)

(58) Field of Classification Search
CPC ...... H05K 7/20263; F28F 3/048; F28F 3/086; F28F 9/0221
See application file for complete search history.

(56) References Cited

U.S. PATENT DOCUMENTS

| 6,968,892 B1 * | 11/2005 | Symonds | F28D 9/0075 165/165 |
| 2003/0037908 A1 * | 2/2003 | Sugito | F28F 3/086 165/104.21 |

(Continued)

FOREIGN PATENT DOCUMENTS

| CN | 2544327 Y | 4/2003 |
| CN | 2847531 Y | 12/2006 |

(Continued)

OTHER PUBLICATIONS

Search Report dated Jul. 24, 2018 issued by Taiwan Intellectual Property Office for counterpart application No. 105128039.
(Continued)

*Primary Examiner* — Tho V Duong
(74) *Attorney, Agent, or Firm* — Demian K. Jackson; Jackson IPG PLLC

(57) ABSTRACT

A water cooling heat dissipation structure includes a first and a second plate, a water cooling heat dissipation body, which is composed of a plurality of stacked heat dissipation members. The first plate, the heat dissipation members, and the second plate are in sequence stacked up into one and another to integrally form the water cooling heat dissipation structure by heat treatment. The water cooling heat dissipation body has a top side attached to one side of the first plate and a bottom side thereof attached to the second plate, so as to secure two sides of a flow passage of the water cooling heat dissipation body. A first and a second connecting portion is respectively provided on two sides of the first plate or the water cooling heat dissipation body, and the first and the second connecting portion is communicable with the flow passage.

9 Claims, 18 Drawing Sheets

(51) Int. Cl.
*F28F 3/04* (2006.01)
*F28F 9/02* (2006.01)

(56) References Cited

U.S. PATENT DOCUMENTS

| | | | | |
|---|---|---|---|---|
| 2005/0126752 A1* | 6/2005 | Matsushima | ............ | F28F 3/12 |
| | | | | 165/80.2 |
| 2008/0115916 A1 | 5/2008 | Schuette | | |
| 2013/0213616 A1* | 8/2013 | Schalansky | ............ | F28F 13/12 |
| | | | | 165/109.1 |
| 2014/0231055 A1* | 8/2014 | Schalansky | ............ | F28F 9/001 |
| | | | | 165/166 |
| 2017/0261272 A1* | 9/2017 | Chomette | ............ | F28F 21/083 |
| 2017/0299239 A1* | 10/2017 | Steven | ............ | F28F 3/086 |

FOREIGN PATENT DOCUMENTS

| | | |
|---|---|---|
| CN | 201018740 Y | 2/2008 |
| CN | 206525065 U | 9/2017 |
| TW | I326026 | 6/2010 |
| TW | M512124 U | 11/2015 |
| TW | M535455 U | 1/2017 |

OTHER PUBLICATIONS

Search Report dated Nov. 30, 2018 issued by Taiwan Intellectual Property Office for counterpart application No. 105128039.

Search Report dated Mar. 25, 2019 issued by China National Intellectual Property Administration for counterpart application No. 2016108098223.

Search Report dated Feb. 13, 2020 issued by China National Intellectual Property Administration for counterpart application No. 2016108098223.

* cited by examiner

WATER COOLING HEAT DISSIPATION STRUCTURE

The present application is a division of U.S. patent application Ser. No. 15/925,894, filed on Mar. 20, 2018.

FIELD OF THE INVENTION

The present invention relates to a water cooling heat dissipation structure, and more specifically, to a water cooling heat dissipation structure that can provide largely improved heat dissipation efficiency.

BACKGROUND OF THE INVENTION

As the advancement of electronic industry and wider application, the computation performance of electronic devices has been largely upgraded. The currently available electronic devices are characterized in their compact volume, low profile and light weight. To meet these requirements, all elements of the electronic devices must also have largely reduced in dimension, allowing the density of Integrated circuits (ICs) is higher and higher. As number the computing elements is increasing, the computation units of the electronic device at high speed also produce much more heat during operation thereof, such that the heat it generates can burn out the entire electronic elements if the heat cannot be dissipated quickly.

To lower the temperature of the heated electronic elements during operation, a water cooling device is available in the market. The water cooling device includes a water cooling structure, two water guiding tubes, and a water pump. The two water guiding tubes are connected to the water pump and a water head, such that a cooling water, or called working fluid, is flowed back and forth in the water cooling device by an operation of the water pump to quickly remove the heat produced by the electronic elements. Please refer to FIG. 1, which is a perspective view of a conventional water cooling device 1. As shown, the water cooling device 1 includes a plurality of flexible heat radiation fins 11, a plurality of flat pipes 12, and two water reservoirs 13 provided on two sides thereof. The flat pipes 12 are paralleled arranged and the heat radiation fins 11 are located in between, such that the flat pipes 12 can correspondingly connected to the heat radiation fins 11 at junctions on a blended outer sides of the heat radiation fins 11 and an outer side of the flat pipes 12 by welding. In other words, the heat radiation fins 11 are connected at several points to the flat pipes 12. Also, the water reservoirs 13 are connected to both the heat radiation fins 11 and the flat pipes 12 by welding to form the water cooling device 1. Each the water reservoirs 13 has a water inlet 131 and a water outlet 132, which are correspondingly connected to two water guiding tubes, respectively (not shown).

The heat radiation fins 11 are connected to the flat pipes 12 by welding, but they are two independent members and not integrally formed, causing heat produced by the electronic elements cannot be effectively transferred from the cooling water to the heat radiation fins 11, and further a thermal resistance occurs when the heat is transferred from the flat pipes 12 to the heat radiation fins 11. It means that the heat cannot be effectively transferred from the flat pipes 12 to the heat radiation fins 11 after the flat pipes 12 absorbs the heat from the cooling water, so as to lower the whole heat dissipation efficiency. Moreover, the flat pipes 12 and the heat radiation fins 11 are connected to each other only at several points on the two outer sides thereof, causing the flexible heat radiation fins 11 to have a weak central portion, which is easy to be damaged or deformed, and accordingly to have adverse heat transfer effect.

Moreover, the conventional water cooling device 1 is composed of three independent members, meaning it is complicated and takes too much time to assemble the conventional cooling system due to many components thereof with water leaking risks.

SUMMARY OF THE INVENTION

To solve the above problems, a primary object of the present invention is to provide a water cooling heat dissipation structure that can provide greatly improved heat dissipation efficiency.

Another object of the present invention is to provide a water cooling heat dissipation structure that can have both increased heat transfer effect and strengthened structural strength.

To achieve the above and other objects, the water cooling heat dissipation structure provided according to the present invention includes a first plate, a second plate, a water cooling heat dissipation body, which is composed of a plurality of stacked heat dissipation members, and a first and a second connecting portion. Each the heat dissipation member has at least one groove extended therethrough and a plurality of turbulent areas provided therein. The grooves of each heat dissipation member are stacked to form at least one flow passage. The turbulent areas of the heat dissipation members are stacked to form a plurality of turbulent sections located in the flow passage. One side of both the first and the second plate is respectively attached to a top and a bottom side of the water cooling heat dissipation body to secure two sides of the flow passage. The first connecting portion provided on one side of the first plate or the water cooling heat dissipation body, whereas the second connecting portion provided on the other side of the first plate or the water cooling heat dissipation body.

The water cooling heat dissipation structure according to another embodiment of the present invention includes a first plate, a second plate, a water cooling heat dissipation body, and a first and a second connecting portions. The water cooling heat dissipation body is composed of a plurality of stacked heat dissipation members, each of which has a plurality of grooves extended therethrough and a plurality of turbulent areas provided therein and at least one connecting groove. The grooves and the connecting groove are stacked to form a plurality of flow passages. The turbulent areas of the heat dissipation members are stacked to form a plurality of turbulent sections located in the flow passage, and the connecting grooves of each heat dissipation member are stacked to form a connecting passage. One side of both the first and the second plate is respectively attached to a top and a bottom side of the water cooling heat dissipation body to secure two sides of the flow passage. The first connecting portion is provided on the first plate or one side of the water cooling heat dissipation body corresponding to the connecting passage, whereas the second connecting portions provided on the first plate or one side of the water cooling heat dissipation body away from the connecting passage.

According to an embodiment of the water cooling heat dissipation structure, each heat dissipation member has a plurality of first heat radiation fins, which is outwardly extended from grooves adjacent thereto of each heat dissipation member. A hollow portion is formed between every two first heat radiation fins.

According to an embodiment of the water cooling heat dissipation structure, the first and each the second connecting portions is provided on the first plate, and, respectively, has a first and a second water guide hole, which is respectively formed and extended through the first and each the second connecting portion and communicable with two ends of each the flow passage of the water cooling heat dissipation body.

According to an embodiment of the water cooling heat dissipation structure, the first and the second connecting portion is communicable with two ends of each the flow passage of the water cooling heat dissipation body.

According to an embodiment of the water cooling heat dissipation structure, each the turbulent area is V-shaped, a slant-line-shaped, a curved-shaped, or other shapes. The turbulent areas of each heat dissipation member are stacked in a positive and negative alternate way to form the turbulent sections.

According to an embodiment of the water cooling heat dissipation structure, the turbulent areas are protruded-shaped to form the protruded turbulent sections spaced on an inner wall of the flow passage after the turbulent areas of each heat dissipation member are stacked up into one and another.

According to an embodiment of the water cooling heat dissipation structure, the first plate has at least one first flow passage covering section and a plurality of second heat radiation fins, which are outwardly extended from a lateral side of the first flow passage covering section. The first flow passage covering section has one side correspondingly connected to the top side of the water cooling heat dissipation body to secure a top side of the corresponding flow passage. The first and the second connecting portion is, respectively, provided on the two ends of the first passage covering section.

According to an embodiment of the water cooling heat dissipation structure, the second plate has at least one second flow passage covering section and a plurality of third heat radiation fins, which are outwardly extended from a lateral side of the second flow passage covering section. The second flow passage covering section has one side correspondingly connected to the bottom side of the water cooling heat dissipation body to secure a bottom side of the corresponding flow passage.

According to an embodiment of the water cooling heat dissipation structure, the first and the second plate and the heat dissipation members are metal laminations. The second plate, the heat dissipation members, and the first plate are stacked bottom up to integrally form the water cooling heat dissipation structure by heat treatment.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
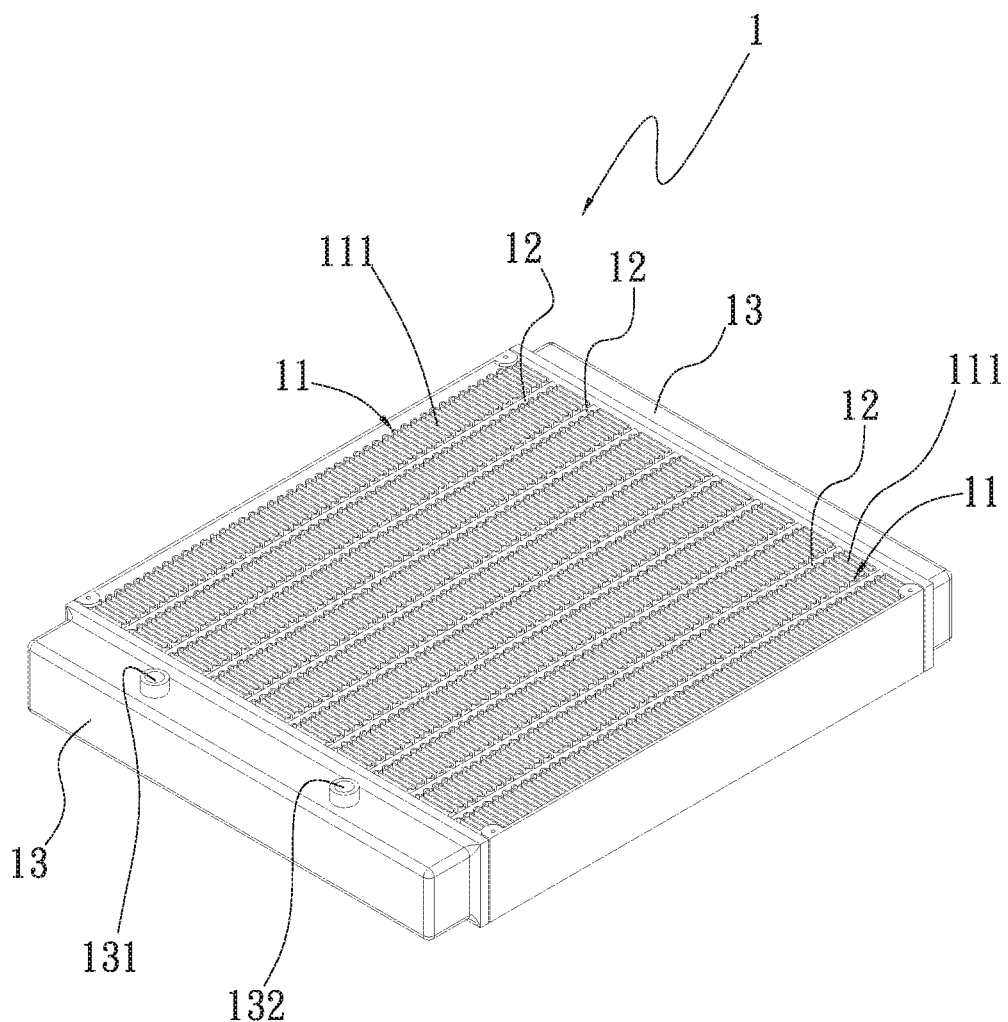
FIG. 1 is an assembled perspective view of a conventional water cooling device.

The present invention will now be described with some preferred embodiments thereof and by referring to the accompanying drawings. For the purpose of easy to understand, elements that are the same in the preferred embodiments are denoted by the same reference numerals.

Figure 2:
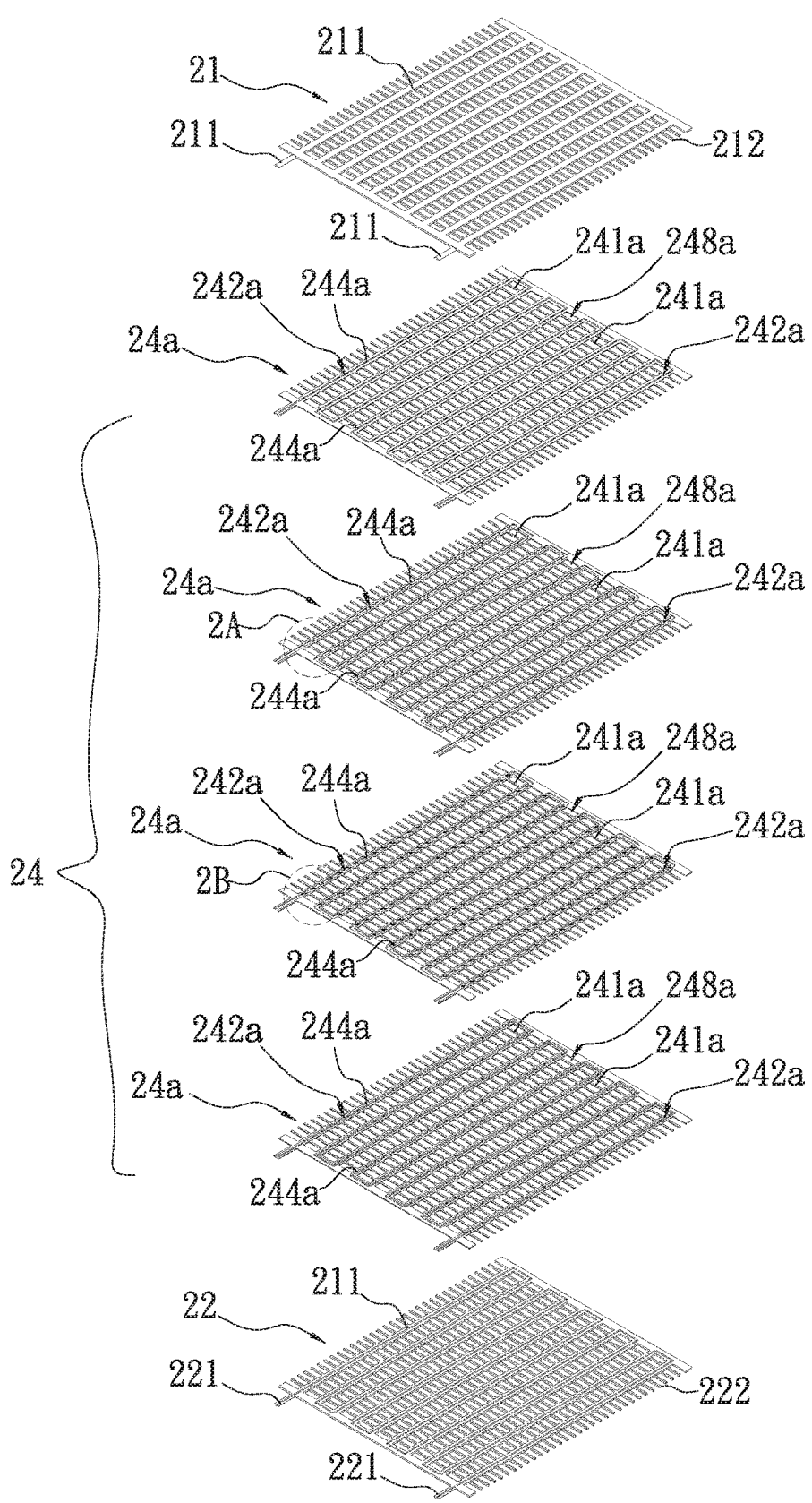
FIG. 2 is an exploded perspective view of a water cooling heat dissipation structure according to a first embodiment of the present invention.
Figure 2A:
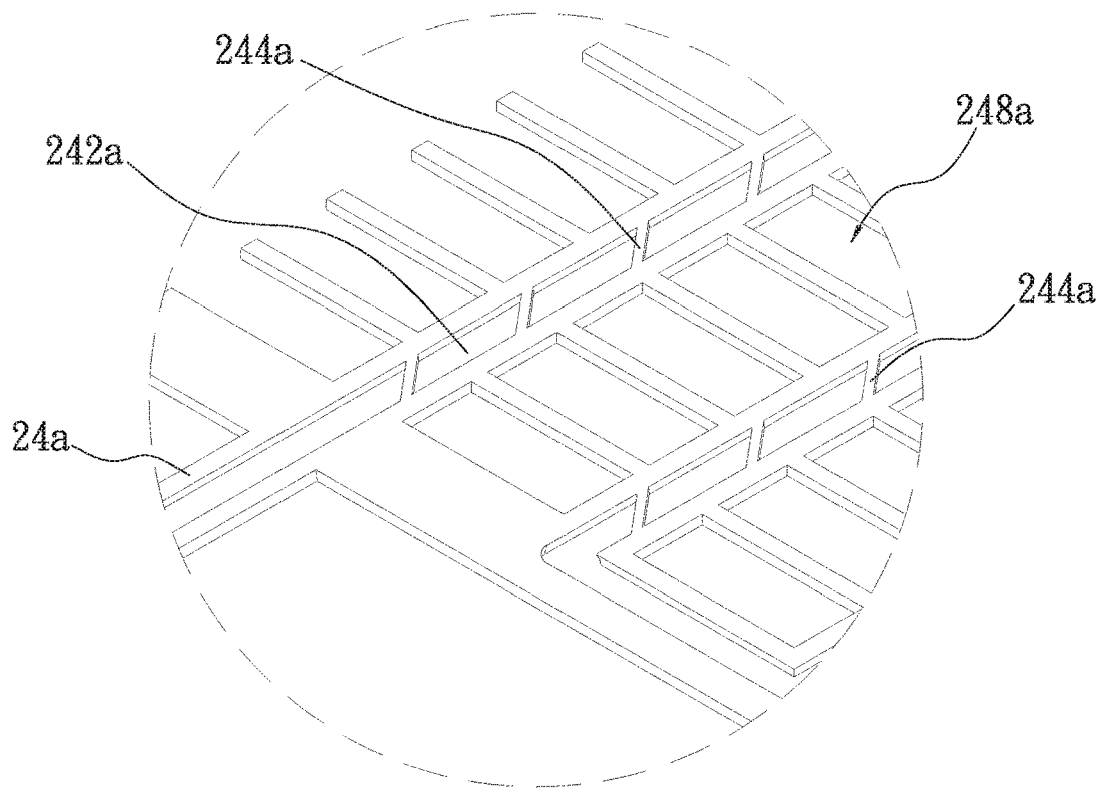
FIGS. 2A and 2B are two partly enlarged views in FIG. 2.
Figure 2B:
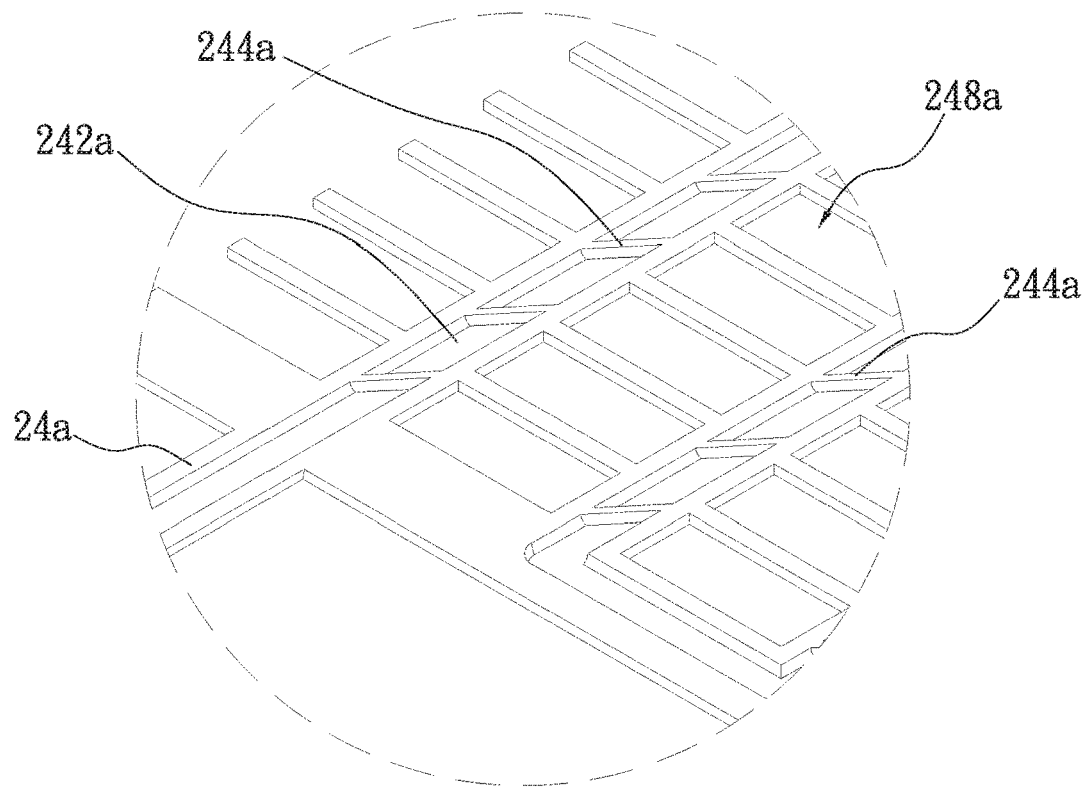
Figure 3A:
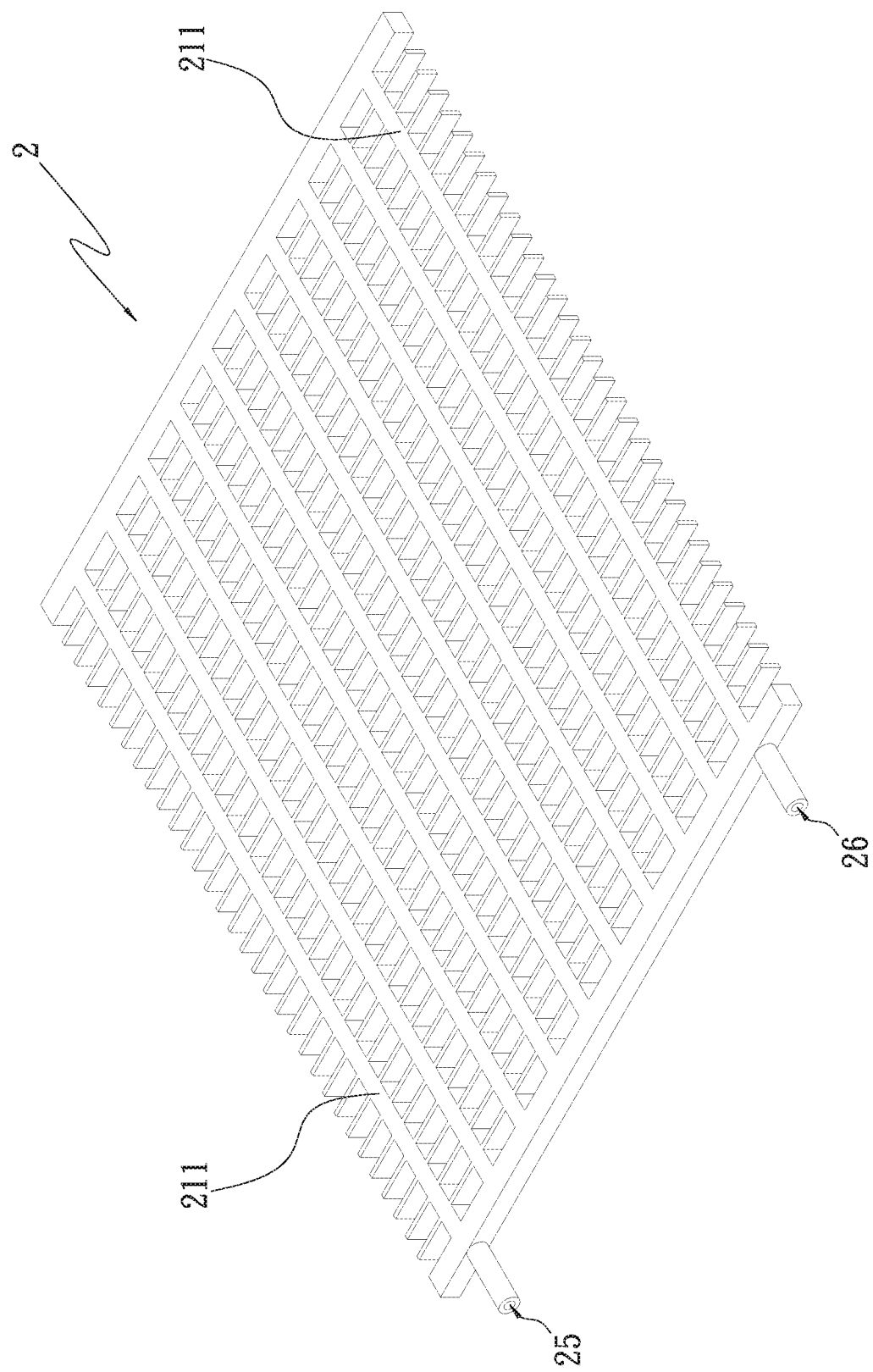
FIG. 3A is an assembled perspective view of FIG. 2.
Figure 3B:
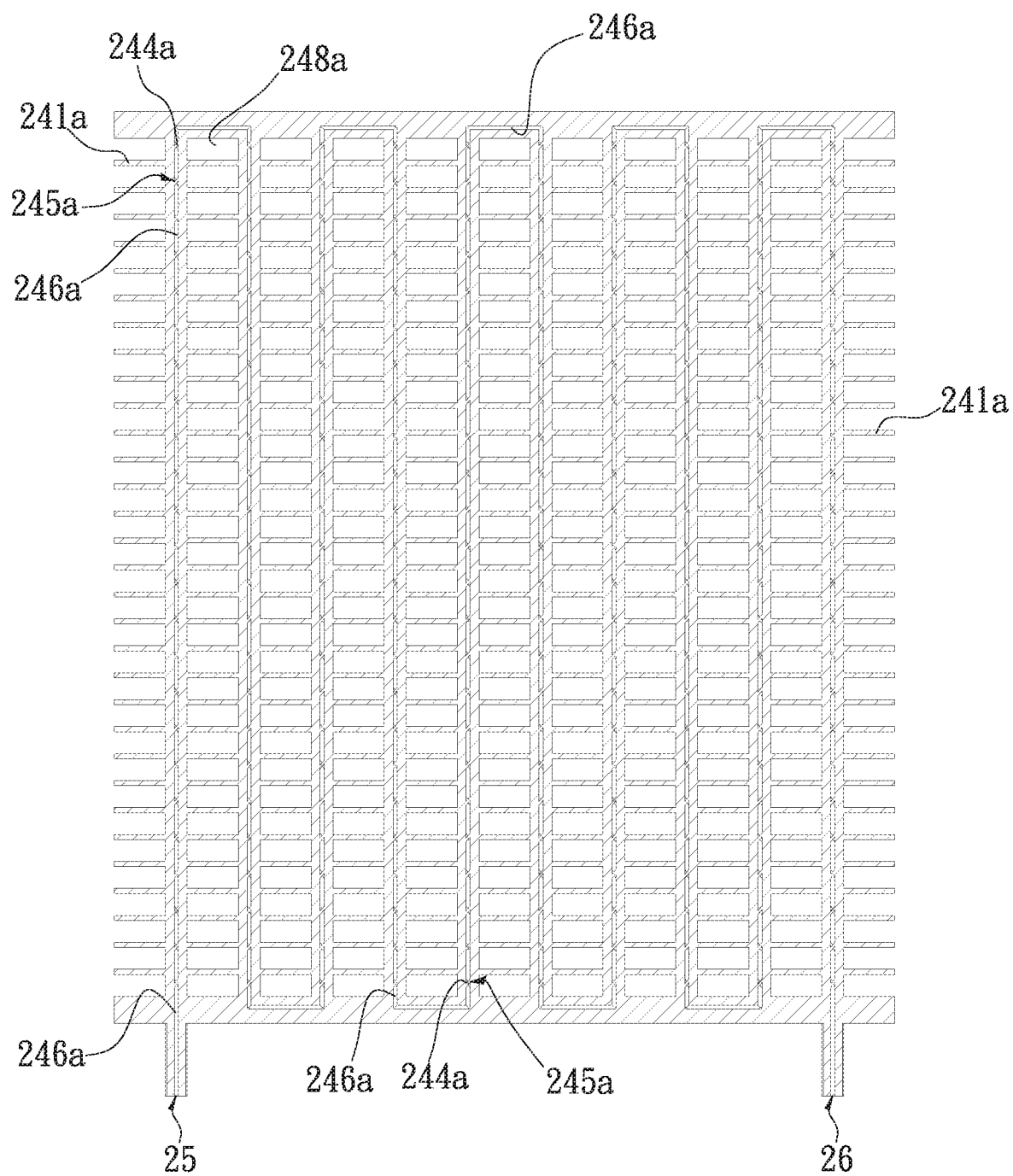
FIG. 3B is a partially sectioned perspective view with slant-line-shaped turbulent areas of the water cooling heat dissipation structure according to the first embodiment of the present invention.
Figure 3C:
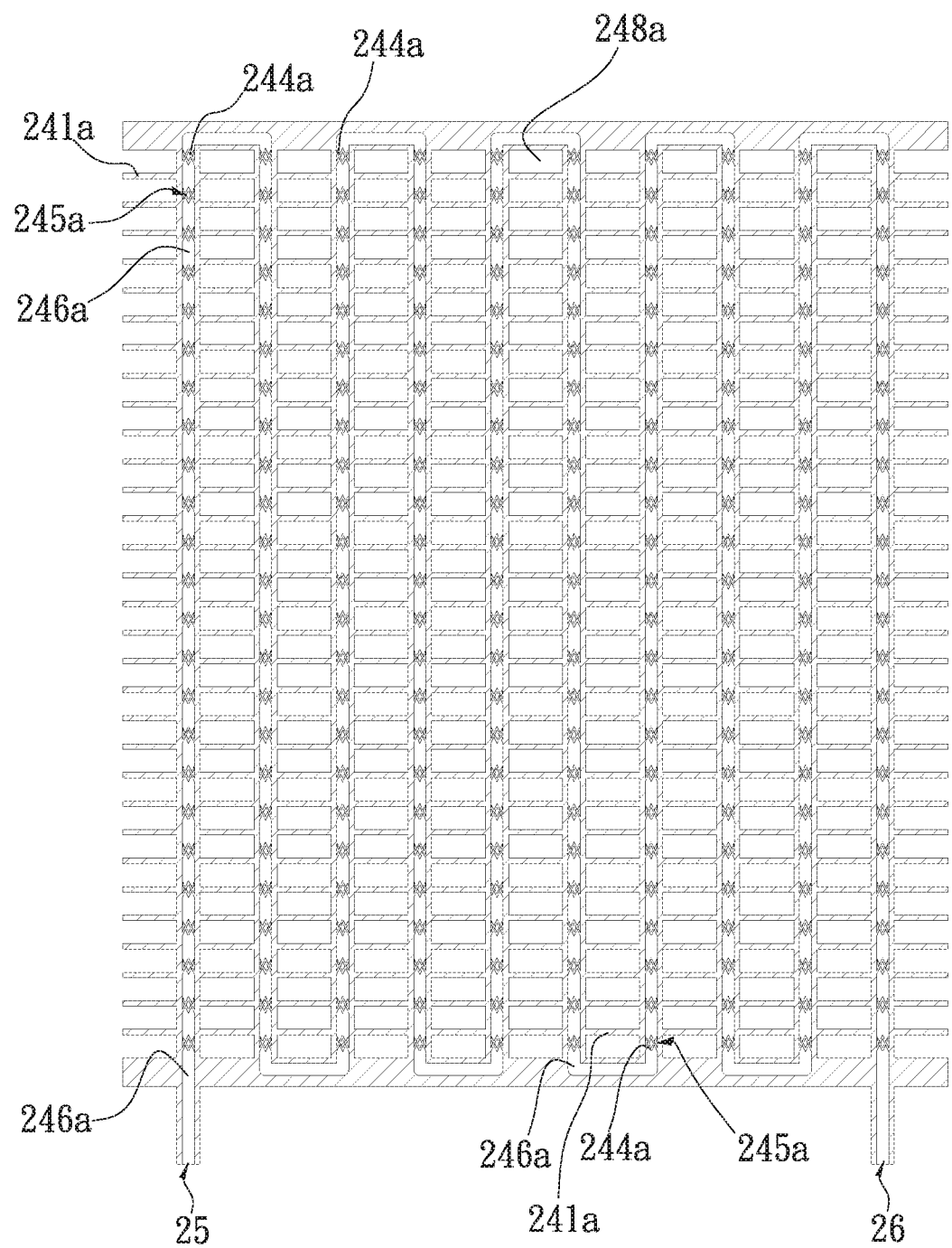
FIG. 3C is a partially sectioned perspective view with V-shaped turbulent areas of the water cooling heat dissipation structure according to the first embodiment of the present invention.
Figure 3D:
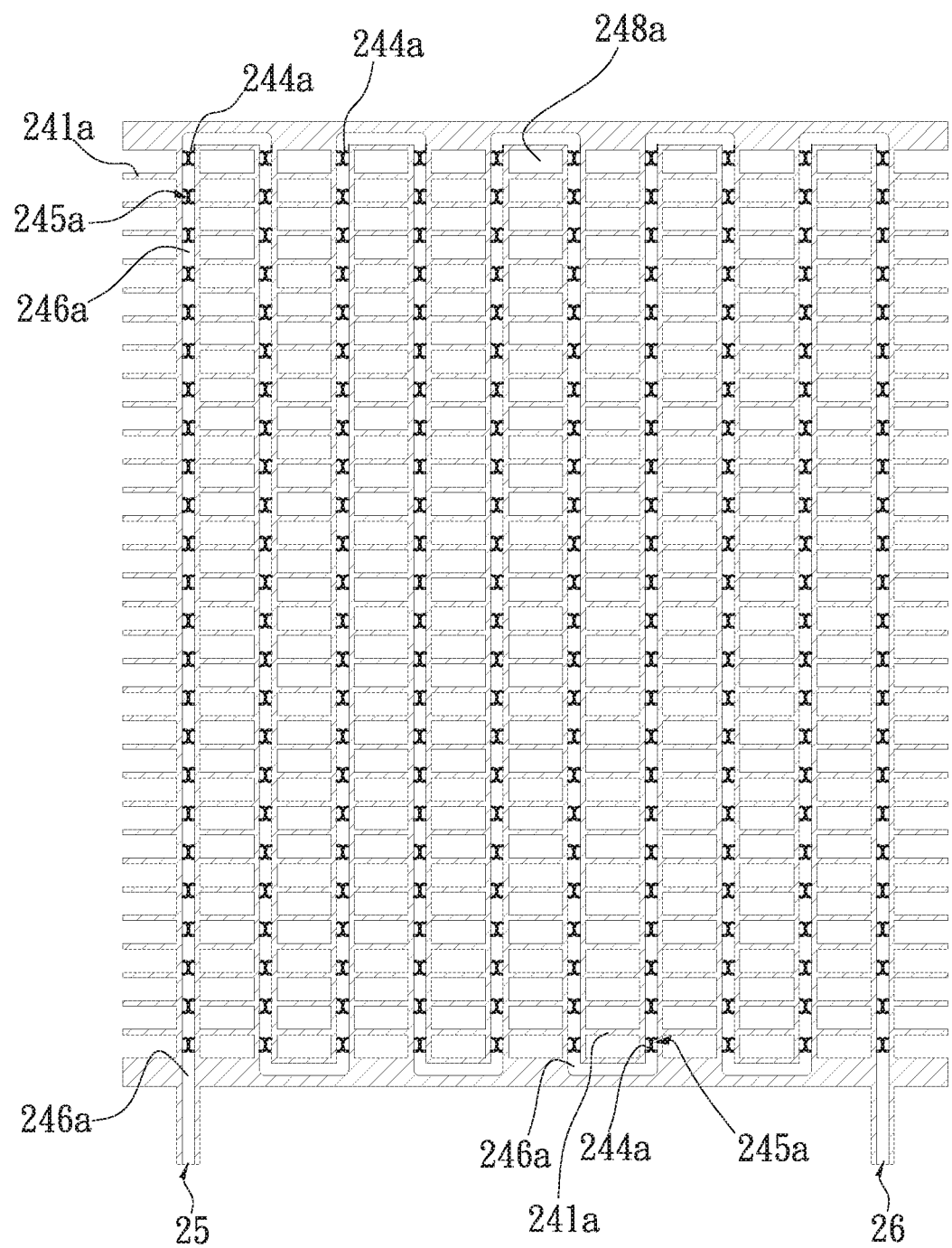
FIG. 3D is a partially sectioned perspective view with curved-shaped turbulent areas of the water cooling heat dissipation structure according to the first embodiment of the present invention.

Please refer to FIGS. 2 and 3, which are exploded and assembled s, respectively, of a water cooling heat dissipation structure according to a first embodiment of the present invention, to FIGS. 2A, 2B, which are two partly enlarged views of FIGS. 2 and 3B, which is a partially sectioned perspective view of the water cooling heat dissipation structure according to the first embodiment of the present invention. For the purpose of conciseness, the present invention is also briefly referred to as the water cooling structure herein and generally denoted by reference numeral 2. As shown, the water cooling structure 2 includes a first plate 21, a second plate 22, a water cooling heat dissipation body 24, which is composed of a plurality of stacked heat dissipation members 24a, and a first and a second connecting portion 25, 26. The heat dissipation members 24a are made of a material of metal, such as copper, aluminum, stainless steel, aluminum-magnesium alloy, titanium, or any other thermally conductive metal slices. Each the heat dissipation member 24a has at least one groove 242a extended therethrough and a plurality of heat radiation fins 241a, which are used for dissipating the absorbed heat to the surrounding air and outwardly extended from the grooves 242a adjacent thereto of each heat dissipation member 24a and a plurality of turbulent areas 244a provided therein. A hollow portion 248a is formed between every two first heat radiation fins 241a and used for allowing more air to pass through. The groove 242a in this illustrated first embodiment is curvedly arranged on and extended through each the heat dissipation member 24a. The two ends of the groove 242a are respectively provided on the same side of each the heat dissipation member 24a. The grooves 242a of each the heat dissipation member 24a are stacked to one and another to form at least one curved flow passage 246a. In practical implementation, the number of the groove 242a can be changed and the shape of the groove 242a can be V-shaped, double-V-shaped, a curved-shaped, and other shapes according to actual needs.

Figure 3E:
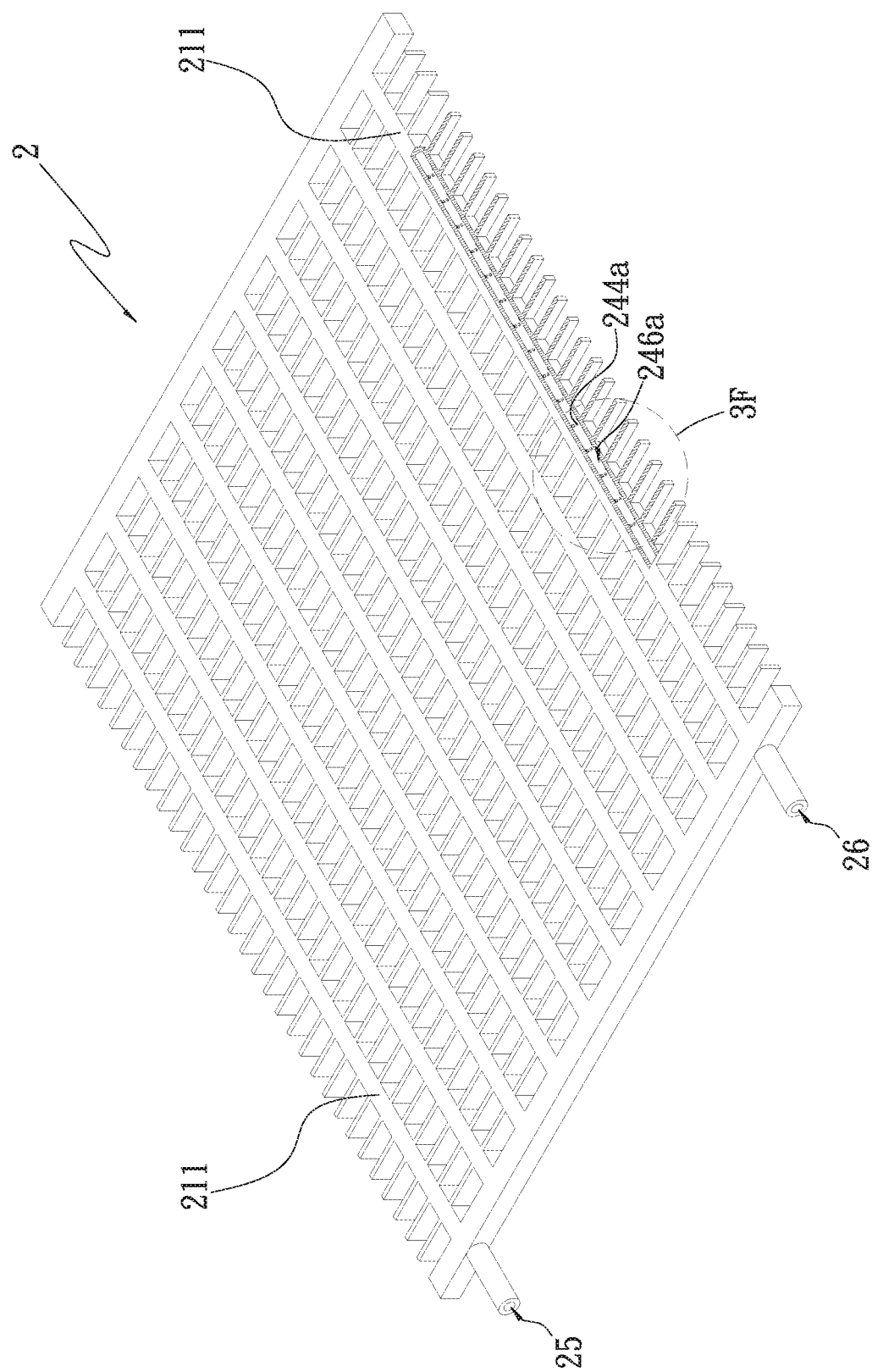
FIG. 3E an assembled perspective view with protruded-shaped turbulent areas of a water cooling heat dissipation structure according to a first embodiment of the present invention.
Figure 3F:
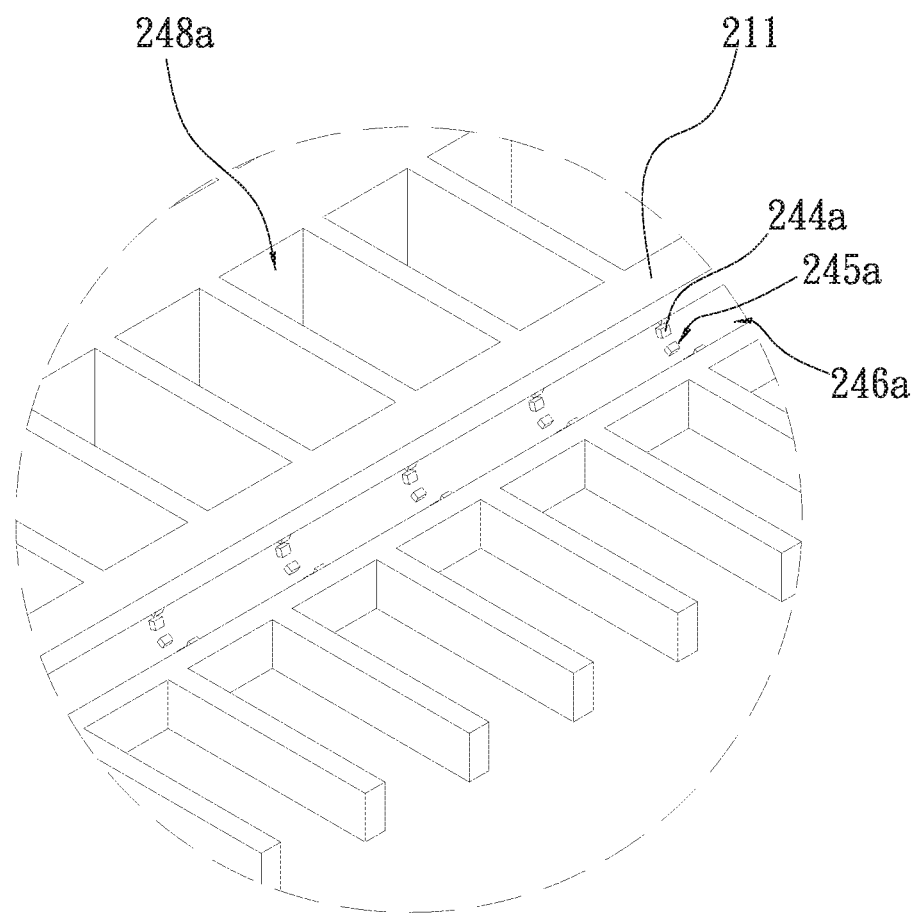
FIG. 3F is a partly enlarged view in FIG. 3E.

The turbulent areas 244a, located in the groove 242a, of the heat dissipation members 24a are stacked to form a plurality of turbulent sections 245a located in the flow passage 246a. Each the turbulent area 244a is a slant line in this embodiment, and one right slant line turbulent area 244a is between every two left slant line turbulent areas 244a, such that the turbulent areas 244a are stacked bottom up in a positive and negative alternate way as shown in FIG. 3B when the heat dissipation members 24a are stacked up into one and another to form the water cooling heat dissipation body 24. In a possible embodiment, the turbulent areas 244a can be changed to V-shaped (see FIG. 3C), curved-shaped (see FIG. 3D), and other shapes. For instance, every two V-shaped turbulent areas 244a have one upsidedown V-shaped turbulent area 244a in between in a positive and negative alternate way. In another possible embodiment, as shown in FIGS. 3E and 3F, the turbulent areas 244a are protruded-shaped to form the protruded turbulent sections 245a spaced on an inner wall of the flow passage 246a after the turbulent areas 244a of each heat dissipation member 24a are stacked up into one and another. When a working fluid, such as pure water or other liquid, is flowed through the turbulent sections 245a, the working fluid collide the turbulent areas 244a to create vortex flow to slow down the working fluid, such that the working fluid can stay longer in the water cooling structure 2.

The second plate 22, the heat dissipation members 24a, and the first plate 21 are stacked bottom up to integrally form the water cooling heat dissipation structure 2 by heat treatment, such as processing by atmosphere furnace, vacuum furnace. The water cooling heat dissipation body 24 has a top side attached to one side of the first plate 21 and a bottom side thereof attached to the second plate 22, so as to secure two sides of a flow passage 246a of the water cooling heat dissipation body 24. In practical usage, the flow passage 246a can be two or more according to the number of the groove 242a of each the heat dissipation member 24a, for example, each the heat dissipation member 24a has two grooves 242a, and then they are stacked to form two flow passages 245a after the heat dissipation members 24a are stacked up into one another to form the water cooling heat dissipation body 24, and the rest can be done in the same manner.

The first plate 21 is made of a material of metal, such as copper, aluminum, stainless steel, aluminum-magnesium alloy, titanium, or any other thermally conductive metal slices. The first plate 21 has at least one first flow passage covering section 211 and a plurality of second heat radiation fins 212, which are outwardly extended from a lateral side of the first flow passage covering section 211 and located corresponding to the first heat radiation fins 241a. The first flow passage covering section 211 is located corresponding to the flow passage 246a and has one side correspondingly connected to the top side of the water cooling heat dissipation body 24 to secure a top side of the corresponding flow passage 246a. The second plate 22 is made of a material of metal, such as copper, aluminum, stainless steel, aluminum-magnesium alloy, titanium, or any other thermally conductive metal slices. The second plate 22 has at least one second flow passage covering section 221 and a plurality of third heat radiation fins 222, which are outwardly extended from a lateral side of the second flow passage covering section 221 and located corresponding to the first heat radiation fins 241a. The second flow passage covering section 221 is located corresponding to the flow passage 246a and has one side correspondingly connected to the bottom side of the water cooling heat dissipation body 24 to secure a bottom side of the corresponding flow passage 246a.

Figure 4:
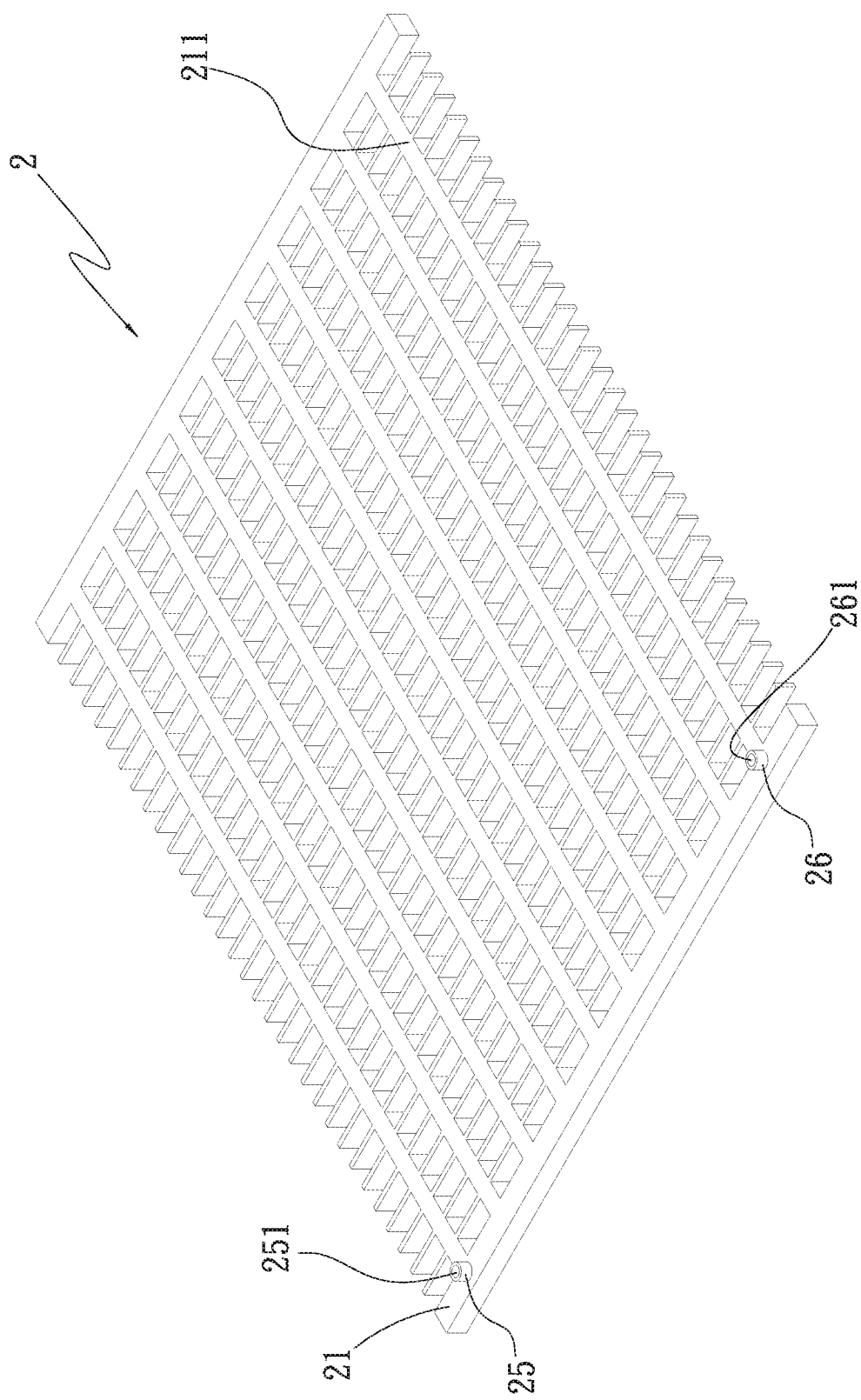
FIG. 4 is another assembled perspective view of the water cooling heat dissipation structure according to the first embodiment of the present invention.

The first and the second connecting portion 25, 26 is selectedly, respectively, provided on two sides of the first plate 21 or the water cooling heat dissipation body 24. In this illustrated first embodiment, the first and the second connecting portion 25, 26 is respectively provided on two sides of the flow passage 246a of the water cooling heat dissipation body 24. The first and the second connecting portion 25, 26 is communicable with two ends of the flow passage 246a, and the first connecting portion 25 is communicable with the second connecting portion 26 via the flow passage 246a, such that the working fluid is flowed in the corresponding flow passage 246a via the first connecting portion 25 and out via the second connecting portion 26. In a possible embodiment, the first and the second connecting portion 25, 26 is provided on the same side of the first plate 21 and respectively located corresponding to the two ends of the first flow passage covering section 211 of the first plate 21 as shown in FIG. 4. The first and the second connecting portion 25, 26 respectively has a first and a second water guide hole 251, 261, which is communicable with the first and the second connecting portion 25, 26 and the two sides of the flow passage 246a of the water cooling heat dissipation body 24.

In practical implementation, the first and the second connecting portion 25, 26 can respectively be connected and communicated with an outlet and an inlet of a water cooling head via two water guiding pipes (not shown), such that heat produced by a heat generating element, such as a central processing unit (CPU) or a graphical display unit, GDU, is absorbed by working fluid in one side of the water cooling head, and then the cooling water is flowed into the flow passage 246a of the water cooling heat dissipation body 24 via the first connecting portion 25 by an operation of a water pump of the water cooling head. After that, the working fluid is flowed along the flexible flow passage 246a in a direction of the other end of the flow passage 246a, and the heat after being transferred to the first, the second, and the third heat radiation fins 241a, 212, 222 at the same time. At last, the heat is dissipated into the surrounding air by the first, the second, and the third heat radiation fins 241a, 212, 222, and the cooling working fluid is flowed back into the water cooling head via the second connecting portion 26 to complete the circulation to achieve water cooling heat dissipation effect.

In a possible embodiment, the water cooling structure 2 is below a fan (now shown), such that the heat can be forcedly quickly dissipated from the water cooling structure 2.

Since each the heat dissipation member 24a has the groove 242a, the first heat radiation fins 241a, and the first and the second plate 21, 22 respectively has the second and the third heat radiation fins 212, 222, the heat the working fluid absorbed can directly be transferred to the first, the second, and the third heat radiation fins 241a, 212, 222 on the first, the second plate 21, 22, and the heat dissipation member 24a to effectively enhance heat transfer efficiency, so as to achieve excellent heat dissipation efficiency. Further, with the first and the second plate 21, 22, and the heat dissipation members are stacked up into one and another, the water cooling structure 2 not only can be easily detachably assembled to one another, but also can enhance the overall structural strength, such that water cooling structure 2 can have effectively increased transfer efficiency and enhanced structural strength. With the flexible flow passage 246a, the working fluid collide the turbulent sections 245a to create vortex flow to slow down the working fluid, such that the working fluid can stay longer in the water cooling structure 2 to provide better heat dissipation effect.

Figure 5:
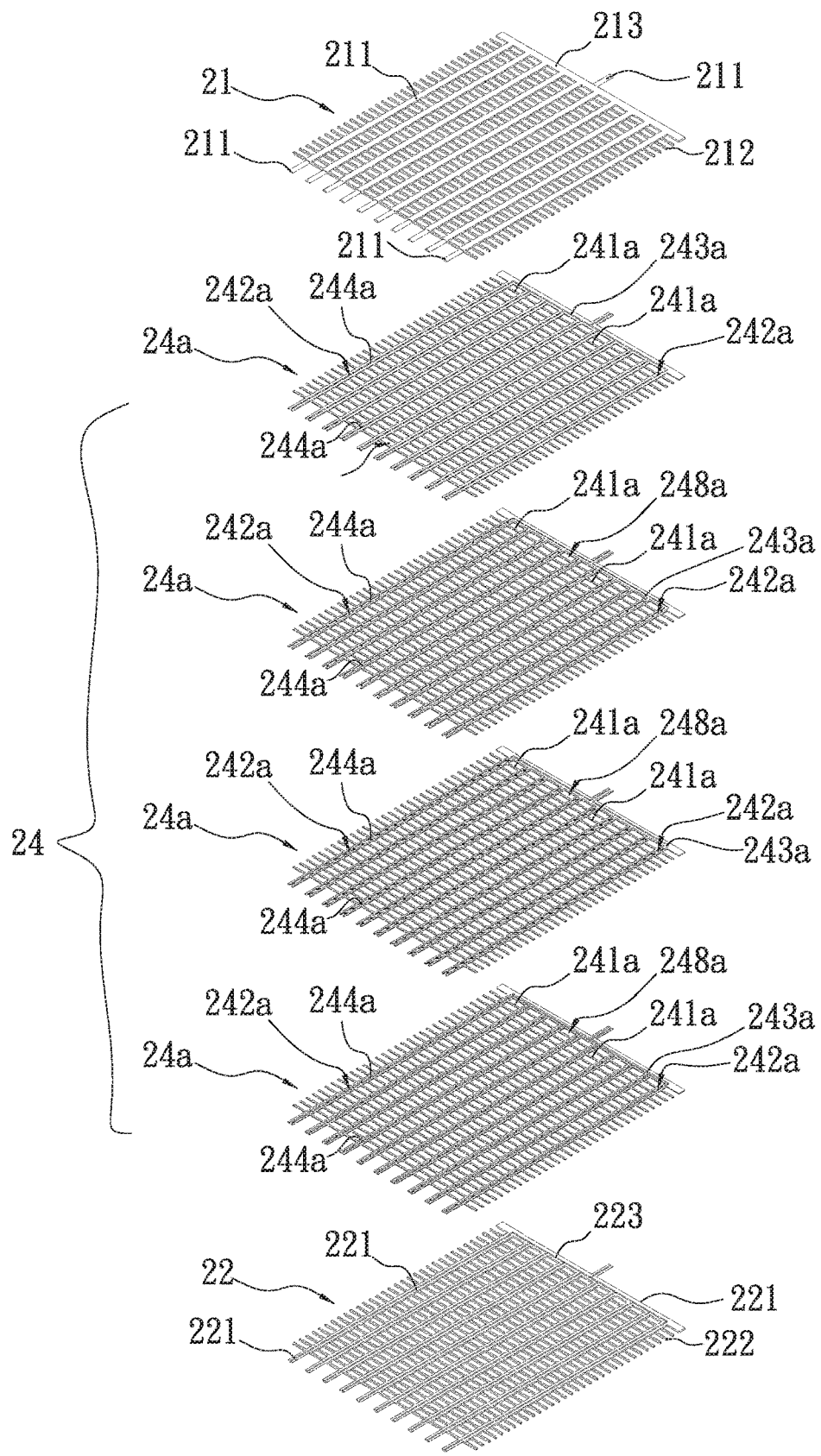
FIG. 5 is an exploded perspective view of the water cooling heat dissipation structure according to a second embodiment of the present invention.
Figure 6A:
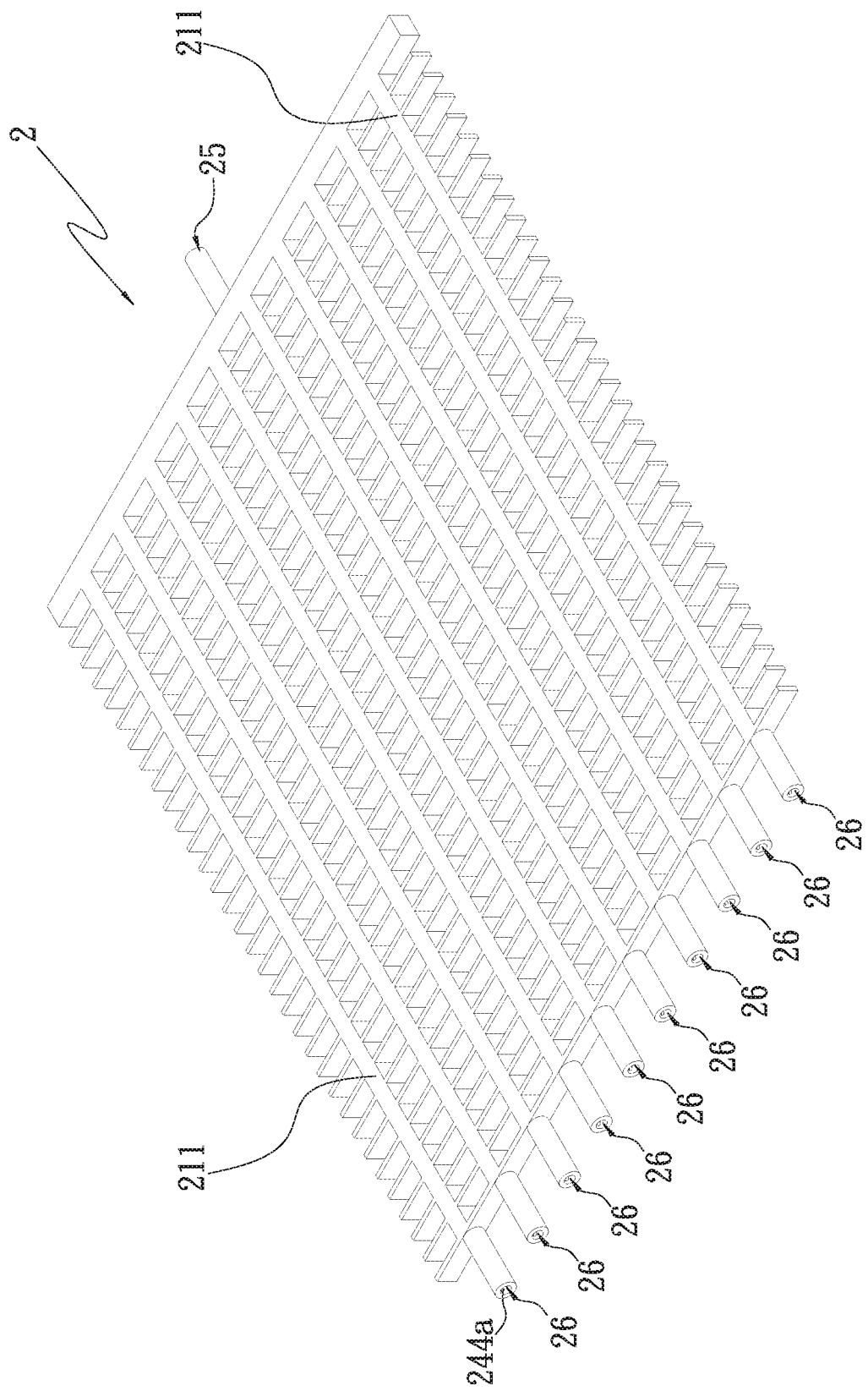
FIG. 6A is an assembled perspective view of FIG. 5.
Figure 6B:
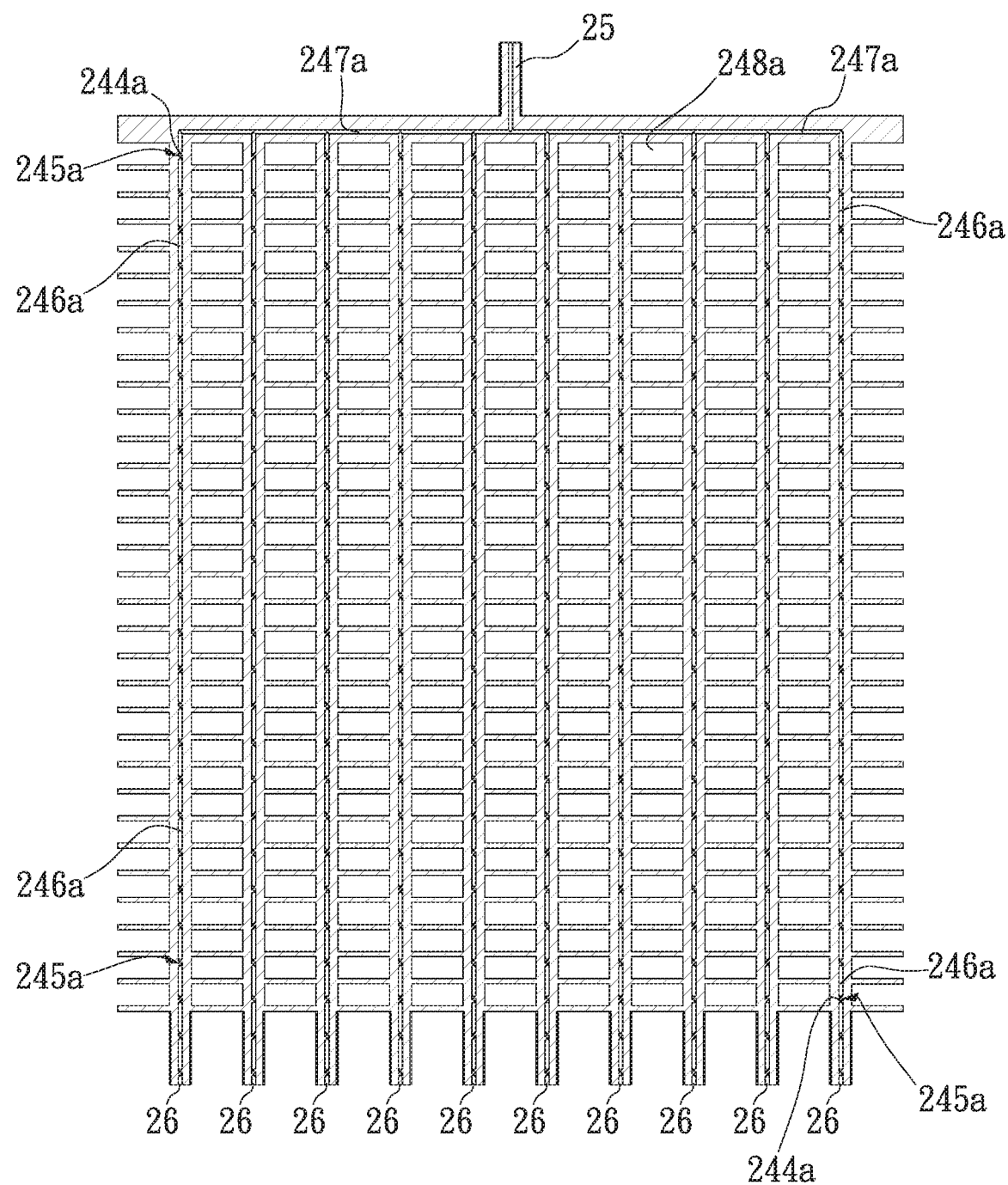
FIG. 6B is a partially sectioned perspective view with slant-line-shaped turbulent areas of the water cooling heat dissipation structure according to the second embodiment of the present invention.
Figure 6C:
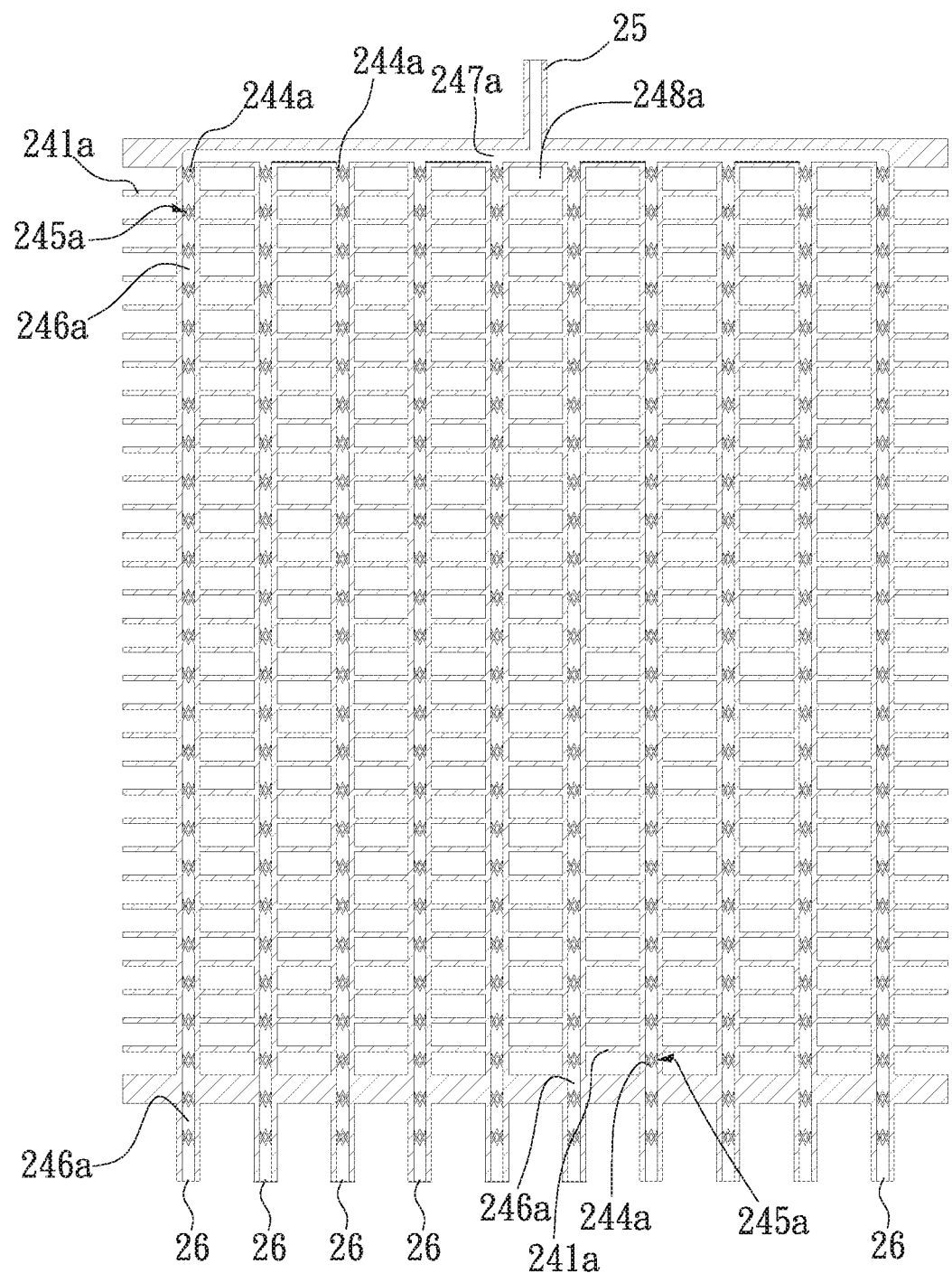
FIG. 6C is a partially sectioned perspective view with V-shaped turbulent areas of the water cooling heat dissipation structure according to the second embodiment of the present invention.
Figure 6D:
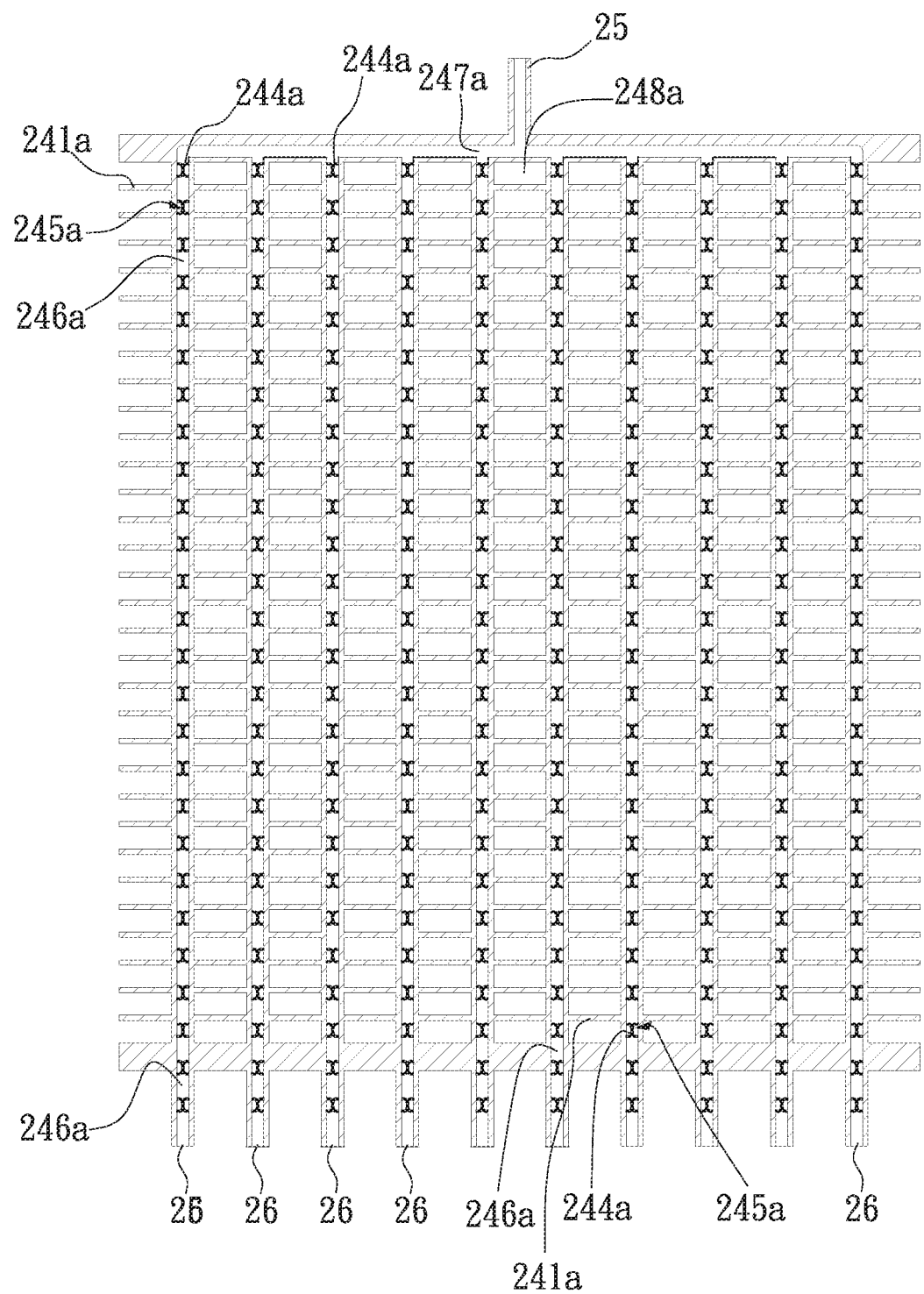
FIG. 6D is a partially sectioned perspective view with curved-shaped turbulent areas of the water cooling heat dissipation structure according to the second embodiment of the present invention.
Figure 6E:
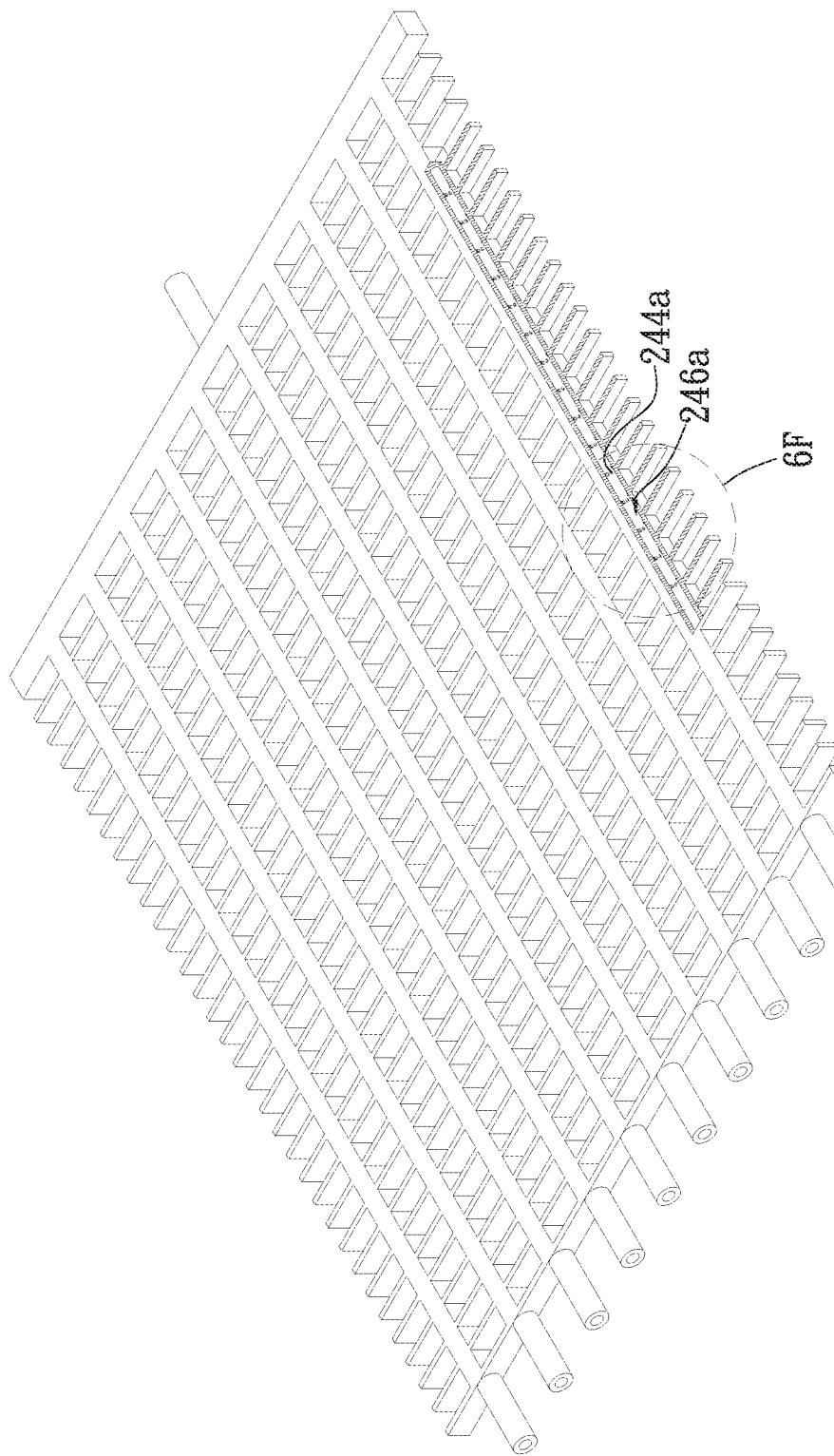
FIG. 6E an assembled perspective view with protruded-shaped turbulent areas of a water cooling heat dissipation structure according to a second embodiment of the present invention.
Figure 6F:
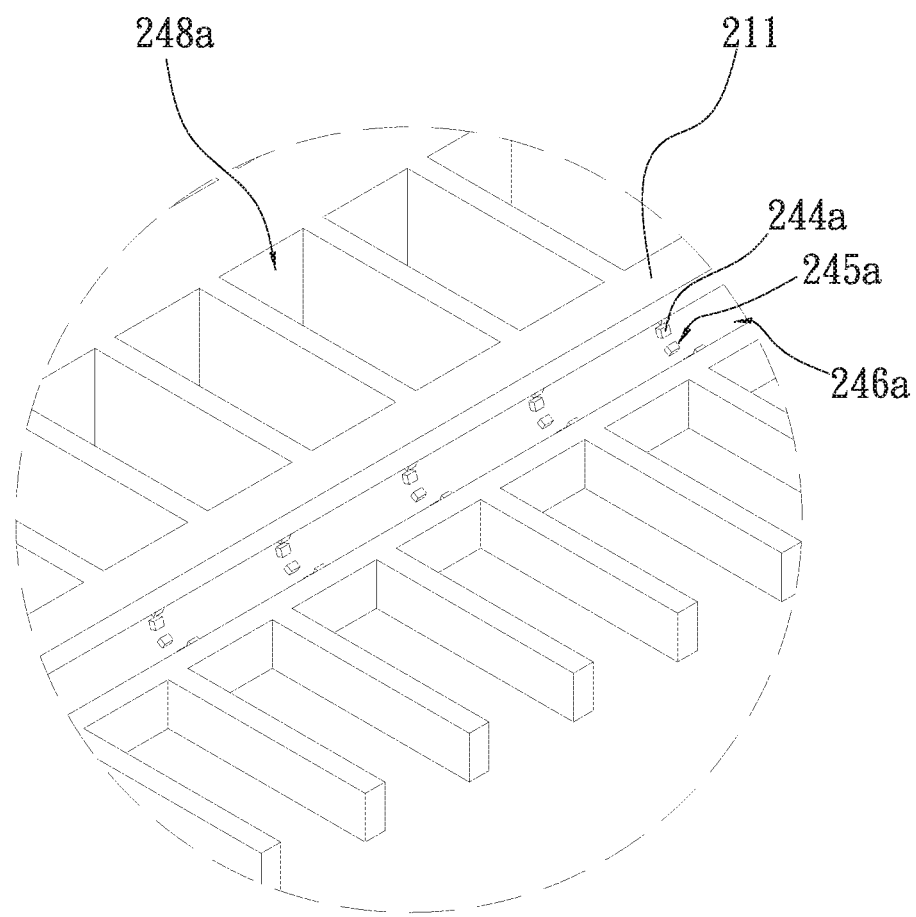
FIG. 6F is a partly enlarged view in FIG. 6E.

Please refer to FIGS. 5 and 6A, which are exploded and assembled perspective views, respectively, of the water cooling structure 2 according to a second embodiment of the present invention, along with FIGS. 6B-6F, which is a partially sectioned perspective view of the water cooling structure 2 according to the second embodiment of the present invention. The second embodiment of the water cooling structure 2 is generally structurally similar to the first embodiment except that, in this second embodiment, each the heat dissipation members 24a has at least one connecting groove 243a and a plurality of grooves 242a. In other words, each the heat dissipation members 24a has a plurality of turbulent areas 244a, a plurality of grooves 242a, a plurality of first heat radiation fins 241a, and at least one connecting groove 243a communicated with the grooves 242a. The grooves 242a and the connecting groove 243a are extended through each the heat dissipation member 24a, and the turbulent areas 244a are located in the grooves 242a. The heat dissipation members 24a are stacked up into one and another to form the water cooling heat dissipation body 24, such that the stacked grooves 242a of the heat dissipation members 24a are stacked up to form a plurality of flow passages 246a, and the turbulent areas 244a of the heat dissipation members 24a form a plurality of turbulent sections 245a located in the flow passages 246a, whereas the connecting grooves 243a of the heat dissipation members 24a form a connecting passage 247a. In this illustrated second embodiment, the connecting passage 247a is perpendicular to the flow passages 246a. The first and the second plate 21, 22 has one side, respectively, attached to a top and a bottom side of the water cooling heat dissipation body 24 to secure the two ends of the flow passages 246a and the connecting passage 247a.

The first plate 21 has a plurality of first flow passage covering sections 211, a first passage covering section 213, and a plurality of second heat radiation fins 212. The first flow passage 211 is corresponding to the flow passage 246a and each the first flow passage covering sections 211 and the passage covering section 213, respectively, has one side correspondingly connected to the top side of the water cooling heat dissipation body 24 to secure a top side of the corresponding flow passage 246a and the connecting passage 247a. The second plate 22 has a plurality of second flow passage covering sections 221, a second passage covering section 223, and a plurality of third heat radiation fins 222. The second flow passage covering sections 221 and the second passage covering section 213, respectively, has one side correspondingly connected to the bottom side of the water cooling heat dissipation body to secure a bottom side of the corresponding flow passage 246a and the connecting passage 247a.

Figure 7:
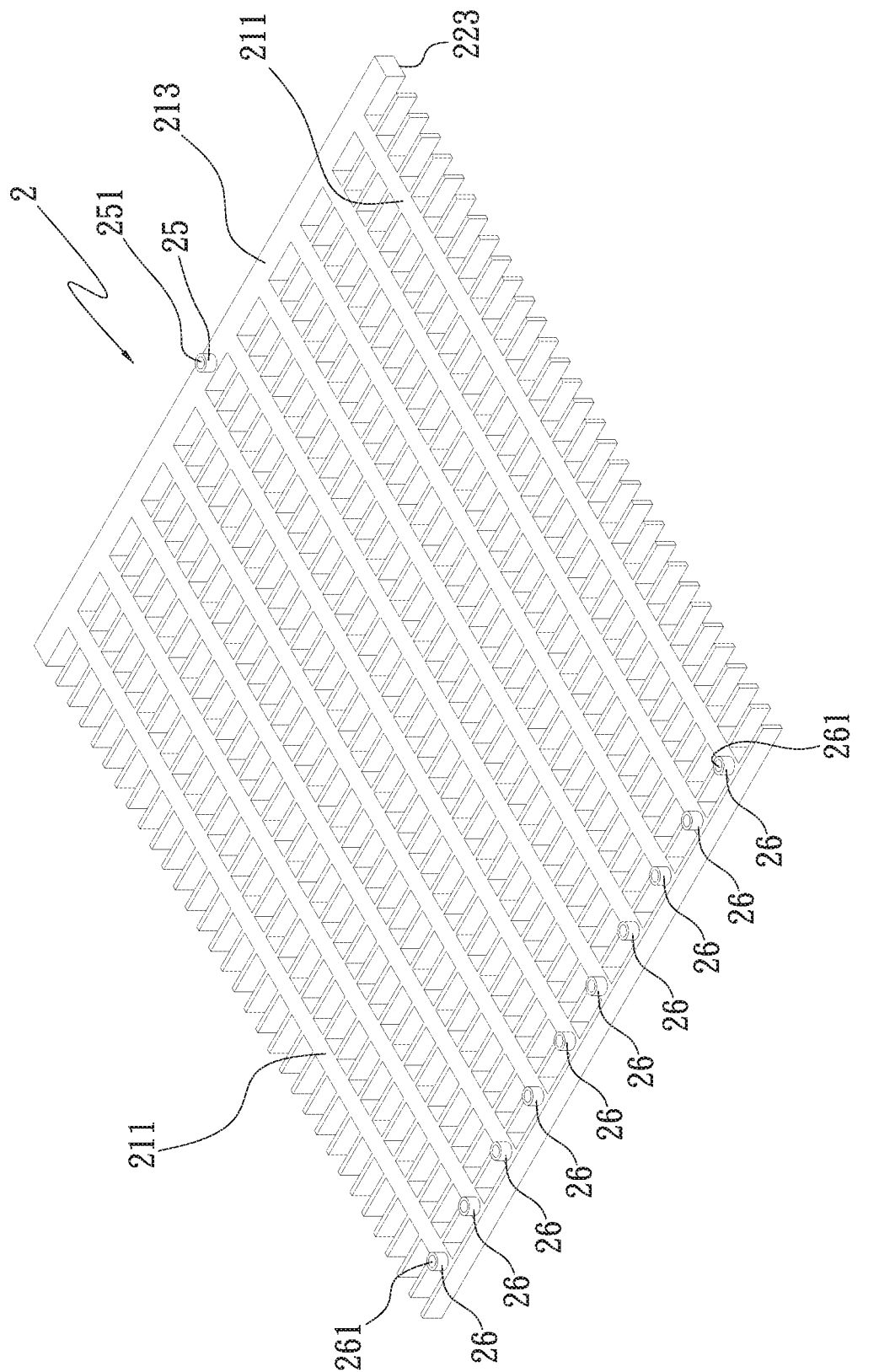
FIG. 7 is another assembled perspective view of the water cooling heat dissipation structure according to the second embodiment of the present invention.

The first connecting portion 25 and the second connecting portions 26 are selectedly, respectively, provided on two sides of the first plate 21 or the water cooling heat dissipation body 24 and respectively located corresponding to two sides of the connecting passage 247a. In this illustrated second embodiment, the first connecting portion 25 is provided on one side of the water cooling heat dissipation body 24 corresponding to the one side of the connecting passage 247a, whereas the second connecting portions 26 are provided on the other side of the flow passage 246a of the water cooling heat dissipation body 24 away from the connecting passage 247a. Each the second connecting portion is communicable with each end of the flow passages 246a, and the other end of the flow passages 246a is correspondingly connected to and communicated with the connecting passage 247a, such that the first connecting portion 25 is communicable with the second connecting portions 26 via the flow passages 246a and the connecting passage 247a. In a possible embodiment, the first and the second connecting portions 25, 26 are provided on the same side of the first plate 21, such that the first connecting portion 25 is located on the first passage covering section 213 of the first plate 21, whereas the second connecting portions 26 are located on the first flow passage covering section 211 of the first plate 21 away from the connecting passage 27a as shown in FIG. 7. The first connecting portion 25 has a first water guide hole 251, and each the second connecting portion 26 respectively has a second water guide hole 261. The first water guide hole 251 and the second water guide holes 261 are communicable with the first and the second connecting portions 25, 26 and the connecting passage 247a and one end of each flow passage 246a. The connecting passage 247a is communicable with the flow passages 246a.

In practical implementation, the first connecting portion 25 and the second connecting portions 26 can respectively be connected and communicated with an outlet and inlets of a water cooling head via a plurality of water guiding pipes (not shown), such that heat produced by a heat generating element, such as a central processing unit (CPU) or a graphical display unit, GDU, is absorbed by working fluid in one side of the water cooling head, and then the cooling water is flowed into the flow passage 246a of the water cooling heat dissipation body 24 via the first connecting portion 25 by an operation of a water pump of the water cooling head. After that, the working fluid is flowed along the flexible flow passage 246a in a direction of the other end of the flow passage 246a, and the heat after being transferred to the first, the second, and the third heat radiation fins 241a, 212, 222 at the same time. At last, the heat is dissipated into the surrounding air by the first, the second, and the third heat radiation fins 241a, 212, 222, and the cooling working fluid is flowed back into the water cooling head via the second connecting portions 26 to complete the circulation to achieve water cooling heat dissipation effect.

With the first and the second plate 21, 22, and the heat dissipation members 24a are stacked up into one and another, the water cooling structure 2 not only can be easily detachably assembled to one another, but also can enhance the overall structural strength, such that water cooling structure 2 can have effectively increased transfer efficiency and enhanced structural strength.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water cooling heat dissipation structure, comprising:
   a first plate;
   a second plate;
   a plurality of heat dissipation members located between the first plate and the second plate and being stacked together to form a water cooling heat dissipation body, each of the heat dissipation members having a plurality of grooves extended therethrough, a plurality of turbulent areas provided in the grooves and at least one connecting groove communicating the grooves, the connecting groove being located at one end of the heat dissipation member and passing through in a short-side direction of the respective heat dissipation members, the grooves passing through the respective heat dissipation members in a lengthwise direction of the connecting groove at intervals, the turbulent areas being solid structures disposed in the respective grooves, the grooves of the heat dissipation members being stacked to form a plurality of flow passages; the turbulent areas of the heat dissipation members being stacked to form a plurality of turbulent sections located in the flow passages, the connecting grooves being stacked to form a connecting passage, one side of both the first and the second plates being respectively attached to a top and a bottom side of the water cooling heat dissipation body to secure a top side and a bottom side of the flow passage;
   a first connecting portion provided on the first plate corresponding to the connecting passage and having a first water guide hole, the first water guide hole being formed through the corresponding first connecting portion; and
   a plurality of second connecting portions provided on the first plate corresponding to the flow passages, each of the second connecting portion having a second water guide hole, the second water guide holes being respectively formed through the each corresponding second connecting portion.

2. The water cooling heat dissipation structure as claimed in claim 1, wherein the connecting passage is disposed on the water cooling heat dissipation body, the flow passages being disposed on the water cooling heat dissipation body in the lengthwise direction of the connecting groove at intervals in communication with the connecting passage.

3. The water cooling heat dissipation structure as claimed in claim 2, wherein the connecting passage and the flow passages are arranged and normal to each other.

4. The water cooling heat dissipation structure as claimed in claim 2, wherein the first and second water guide holes being respectively in communication with one end of the corresponding connecting passage and one end of each flow passage, the connecting passage being in communication with the flow passages.

5. The water cooling heat dissipation structure as claimed in claim 2, wherein the turbulent area of each heat dissipation member and the turbulent area of each adjacent heat dissipation member are directed in reverse and staggered directions and are stacked to form the multiple turbulent sections in cross form.

6. The water cooling heat dissipation structure as claimed in claim 2, wherein the turbulent areas are protrusion bodies, the turbulent areas of each turbulent section being stacked to protrude from an inner wall of each flow passage.

7. The water cooling heat dissipation structure as claimed in claim 3, wherein the first plate has a plurality of first flow passage covering sections, a first passage covering section, and a plurality of second heat radiation fins, which being outwardly extended from a lateral side of the first flow passage covering section; the first flow passage covering section and the first passage covering section, respectively, having one side correspondingly connected to the top side of the water cooling heat dissipation body to secure a top side of the corresponding flow passage and the connecting passage; and the first connecting portion being provided on the first passage covering section, whereas the second connecting portions being provided on one end of the first flow passage covering section away from the first passage covering section.

8. The water cooling heat dissipation structure as claimed in claim 7, wherein the second plate has a plurality of second flow passage covering sections, a second passage covering section, and a plurality of third heat radiation fins, which being outwardly extended from a lateral side of the second flow passage covering section; the second flow passage covering section and the second passage covering section, respectively, having one side being correspondingly connected to the bottom side of the water cooling heat dissipation body to secure a bottom side of the corresponding flow passage and the connecting passage.

9. The water cooling heat dissipation structure as claimed in claim 1, wherein each heat dissipation member has a plurality of first heat radiation fins, the first heat radiation fins outward protruding from one side of each heat dissipation member in adjacency to the groove, each two adjacent first heat radiation fins defining therebetween a hollow section.

* * * * *